United States Patent [19]

Cox

[11] Patent Number: 4,843,344
[45] Date of Patent: Jun. 27, 1989

[54] HIGH VOLTAGE AMPLIFIER

[75] Inventor: Mason F. Cox, Shelby, N.Y.

[73] Assignee: Monroe Electronics, Inc., Lyndonville, N.Y.

[21] Appl. No.: 229,785

[22] Filed: Aug. 8, 1988

Related U.S. Application Data

[63] Continuation of Ser. No. 106,652, Oct. 9, 1987, which is a continuation-in-part of Ser. No. 917,144, Oct. 9, 1986.

[51] Int. Cl.⁴ .............................................. H03F 3/16
[52] U.S. Cl. .................................. 330/264; 330/277; 330/297
[58] Field of Search ................ 324/72, 72.5, 457, 458; 330/264, 277, 297, 300, 311

[56] References Cited

U.S. PATENT DOCUMENTS

| | | | |
|---|---|---|---|
| 3,611,127 | 10/1971 | Vosteen | 324/72 |
| 3,675,143 | 7/1972 | Greene | 330/277 |
| 3,887,878 | 6/1975 | Schade, Jr. | 330/263 |
| 3,921,087 | 11/1975 | Vosteen | 330/2 |
| 3,947,727 | 3/1976 | Stewart | 330/264 |
| 4,090,139 | 5/1978 | Hoover | 330/264 |
| 4,296,382 | 10/1981 | Hoover | 330/264 |
| 4,317,055 | 2/1982 | Yoshida et al. | 330/264 |
| 4,370,615 | 1/1983 | Whistler et al. | 324/457 |
| 4,529,948 | 7/1985 | Bingham | 330/264 |
| 4,622,482 | 11/1986 | Ganger | 330/264 |
| 4,734,654 | 2/1988 | Fernandez | 330/277 |

OTHER PUBLICATIONS

Designing With Field Effect Transistors, edited by Arthur D. Evans, p. 274.

Primary Examiner—Steven Mottola
Attorney, Agent, or Firm—Finnegan, Henderson, Farabow, Garrett & Dunner

[57] ABSTRACT

A voltage amplifier for amplifying an input voltage signal is disclosed. The amplifier includes a string of MOSFET circuits coupled between a voltage-to-current converter and a high voltage power supply terminal. The string of MOSFET circuits may be expanded to achieve linear voltage amplification over a wide voltage range.

6 Claims, 7 Drawing Sheets

HIGH VOLTAGE AMPLIFIER

BACKGROUND OF THE INVENTION

This application is a continuation of application Ser. No. 07/106,652, filed Oct. 9, 1987 which is a continuation-in-part to the application of William Vosteen and Mason Forrest Cox, Ser. No. 06/917,144, filed on Oct. 9, 1986.

FIELD OF THE INVENTION

This invention relates generally to amplifier circuits and, more particularly, to high voltage amplifier circuits.

BACKGROUND INFORMATION

It is known in the art to measure the electrostatic field and potential of a test surface using a non-contacting voltage metering apparatus employing means for modulating the capacitance between the metering apparatus and a test surface to be measured. Such apparatus is shown, for example, in U.S. Pat. No 3,611,127 to Vosteen and assigned to the assignee of the present invention.

While such metering apparatus is highly accurate and stable, the frequency range, or bandwidth, over which the metering apparatus may effectively operate is limited by the frequency at which the capacitance is modulated.

Typically, the alternating current (AC) potential of the surface under test may not be adequately measured for AC voltages in excess of one-half the frequency of modulation. For example, a conventional metering apparatus having a modulating frequency between 1000 and 2000 hertz, will have a maximum frequency response of between 500 and 1000 hertz.

Various techniques have been used in the prior art to increase the frequency range for voltage metering apparatus. For example, metering apparatus having somewhat higher frequency response is known which utilizes a preamplifier and an integrator having a high frequency response path therebetween for high frequency signals. However, the introduction of the modulating frequency signal, which is itself a signal of relatively high frequency, into the integrator limits long-term stability in the metering apparatus.

A novel voltage metering apparatus, which overcomes the high frequency response and instability problems for metering apparatus and which has improved noise immunity, is presented in the above-cited parent application. That novel apparatus also has improved high voltage measuring capability, achieved using a novel high voltage amplifier. The high voltage amplifier of the present invention may be used outside the area of voltage metering, however.

Voltage amplifiers are known for providing voltage amplification of an input signal within a predetermined voltage range. Typically, such voltage amplifiers are restricted to lower ranges of voltage amplification, and are subject to the negative effects of high frequency signals. Typically, also, known voltage amplifiers tend to provide non-linear voltage amplification outside a limited range.

Accordingly, an object of the present invention is to provide a high voltage amplifier having a design such that the amplifier can be expanded as necessary to provide relatively linear amplification over a wide voltage range.

A further object of the invention is to provide a high voltage amplifier having good high frequency response.

Additional objects and advantages of the invention will be set forth in the description which follows, and in part will be obvious from the description or may be learned by practice of the invention.

SUMMARY OF THE INVENTION

To achieve the objects, and in accordance with the purposes of the invention as embodied and as broadly described herein, the invention provides a high voltage amplifier, coupled to a high voltage power supply terminal, for amplifying an input voltage signal. The amplifier comprises control means, coupled to receive the input voltage signal, for generating an output current signal proportional to the input voltage signal; and load means, coupled to the control means and to the high voltage power supply terminal, for producing an output voltage signal from the output current. The output voltage signal is proportional to the input voltage signal. The load means includes a plurality of MOSFET circuits connected in cascade between the control means and the high voltage power supply terminal. The MOSFET circuits each include a MOSFET having a gate, a source and a drain, and are biased in the linear region. The MOSFET circuits are connected such that the voltage drop across each of the MOSFET circuits is substantially the same.

The accompanying drawings, which are incorporated in and which constitute a part of this specification, illustrate preferred embodiments of this invention, and together with the description, explain the principals of this invention.

DESCRIPTION OF THE PREFERRED EMBODIMENTS

Figure 1:
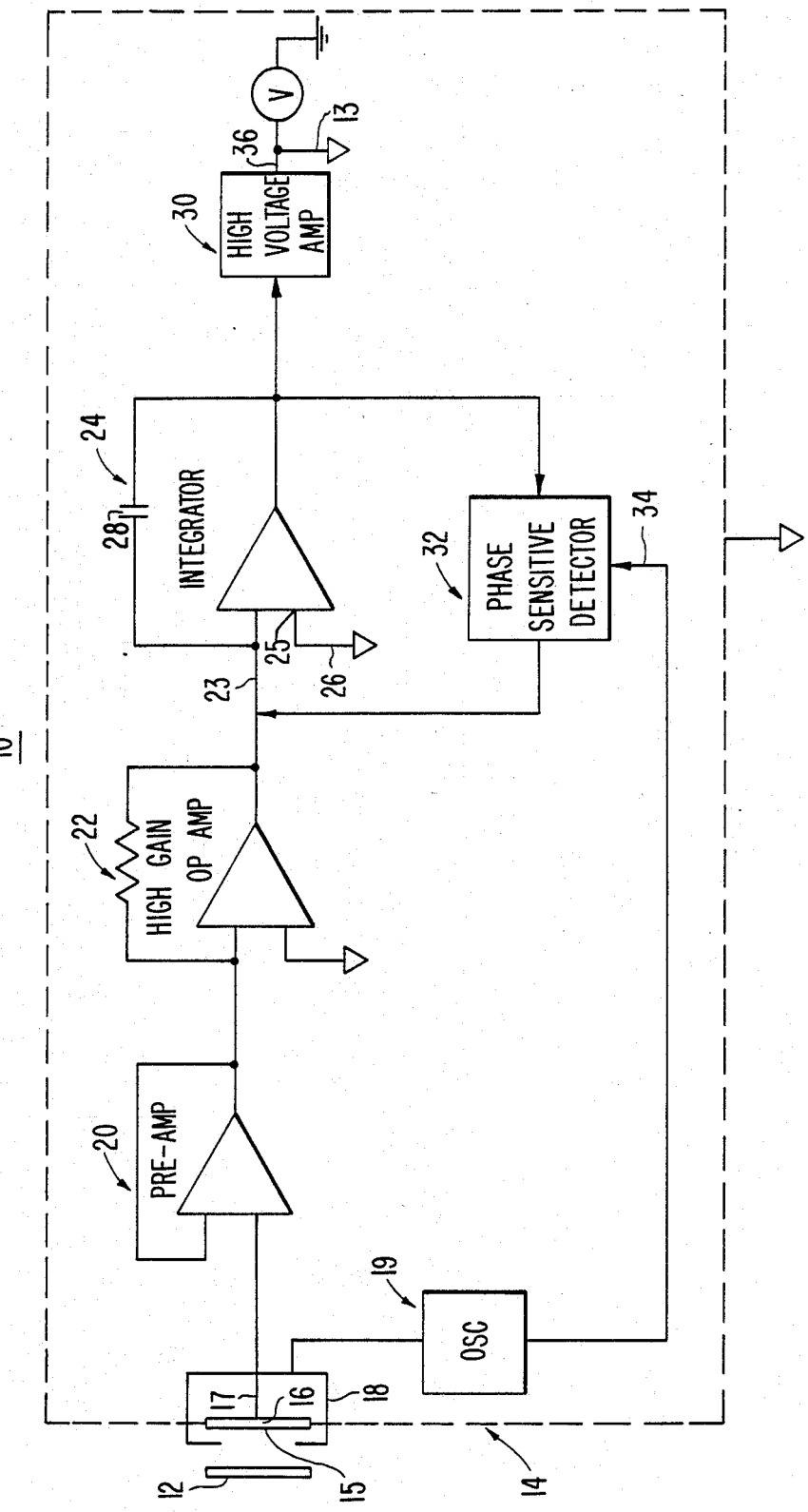
FIG. 1 is a block diagram of metering apparatus which including a preferred embodiment of the invention.

Reference will now be made in detail to the preferred embodiments of the invention, examples of which are illustrated in the accompanying drawings in which like reference characters refer to like elements.

Referring to FIG. 1, there is shown a non-contacting voltage metering apparatus 10 for monitoring the electrical potential between a test surface 12 and a universal reference 13. Metering apparatus 10 includes a housing 14, establishing a local reference potential.

Mounted in housing 14 is a sensing electrode 16 which is positioned across from and in proximity to test surface 12 such that a surface 15 of sensing electrode 16 is capacitively coupled to test surface 12. Apparatus 10 includes means for modulating the capacitive coupling between the test surface and the electrode surface at a predetermined frequency, the capacitive coupling between test surface 12 and surface 15 of sensing electrode 16 being modulated by less than one hundred percent and preferably by no more than fifty percent. As embodied herein, the modulating means comprises a tuning fork mechanism 18 which mechnically modulates the capacitive coupling between test surface 12 and the surface of sensing electrode 16. A tuning fork mechanism of the type described is disclosed in U.S. Pat. No. 3,921,087 to Vosteen. The frequency of vibration of sensing electrode 16 by tuning fork mechanism 18 is controlled by an oscillator 19 which is connected to tuning fork mechanism 18. The frequency of oscillator 19 is hereinafter referred to as a reference frequency.

The modulation of the capacitive coupling between test surface 12 and sensing electrode 16 induces a capacitive voltage on surface 15 of sensing electrode 16, the induced voltage being proportional to the voltage existing at test surface 12 which may include direct current (DC) and AC components.

As is well known to those skilled in the art, other means of modulating the capacitive coupling between test surface 12 and surface 15 of sensing electrode 16 may be provided, such as a rotating shutter or vibrating electrode.

Sensing electrode 16 has an output terminal 17 which is coupled to amplifying means having an input and an output for amplifying a voltage present on electrode output terminal 17. Preferably, electrode output terminal 17 is coupled to an input terminal of a preamplifier 20 which comprises a first stage of the amplifying means. The output of preamplifier 20 is preferably connected to a high gain wideband amplifier 22 which compises a second stage of the amplifying means. Since the voltage induced on surface 15 of sensing electrode 16 is induced by what are, typically, small capacitance variations (on the order of picofarads), it is necessary in preserving the sensing electrode voltage to minimize the capacitive loading on sensing electrode 16. Accordingly, preamplifier 20 comprises a wideband operational amplifier having extremely high input resistance and low input capacitance. High gain operational amplifier 22 further amplifies the signal from sensing electrode 16 by a gain of, for example, 20. Both amplifier 20 and high gain operational amplifier 22 are wideband amplifiers responsive to low and high frequency signals.

The output of high gain operational amplifier 22 is coupled to one input 23 of integrator 24, the other input 25 of which is connected to housing 14 through a circuit common connection 26. The output of integrator 24 is coupled to a high voltage amplifier 30 having an output connected to the reference surface. The input of high voltage amplifier 30 is coupled to the output of integrator 24. The output of integrator 24 is coupled to the input of a phase sensitive detector 32. The output of phase sensitive detector 32 is connected to input 23 of integrator 24. Phase sensitive detector 32 includes a reference terminal 34 coupled to reference oscillator 19, and utilizes the signal supplied to reference terminal 34 by oscillator 19 to demodulate the input received from integrator 24. The input received from integrator 24 comprises a signal having an amplitude proportional to and a polarity the same as test surface 12. Since the voltage induced on sensing electrode 16 is induced by tuning fork mechanism 18 in accordance with the frequency of oscillator 24, the output of integrator 19 is a signal having a component the frequency of which is equivalent to the frequency of oscillator 19.

Phase sensitive detector 32 compares the oscillator signal at reference terminal 34 to the input signal from integrator 24 to produce a DC output which is fed back into integrator 24 to cancel the effect of the voltage-inducing oscillation. Accordingly, the output of phase sensitive detector 32 is a signal indicating the amplitude and polarity of test surface 12 as it would be measured by an ideal stationary voltage detector capable of contacting test surface 12 without affecting the voltage thereupon. Because the reference frequency is demodulated from the output of integrator 24 by phase sensitive detector 32, and not passed to circuit common (as in the prior art), the long-term stability of voltage metering apparatus 10 is enhanced.

The output of integrator 24 is coupled to the input of high voltage operational amplifier 30 to produce a high voltage output. The input to high voltage amplifier 30 may be on the order of, for example, 0 to 5 volts and the output may be on the order of, for example, 0 to 2000 volts.

The output of the voltage metering apparatus is used to drive circuit common to the potential of test surface 12. As circuit common 26 approaches the test surface potential, the voltage induced on sensing electrode 16 approaches zero, the potential on electrode output terminal 17 being a measure of the potential between circuit common 26 and the test surface potential. The test surface potential is obtained, therefore, by a measure of the potential between circuit common 26 of housing 14 and true ground. Apparatus 10 thus provides a highly stable and accurate voltage metering apparatus in which the high frequency response is limited only by the bandwidth of preamplifier 20, amplifier 22, integrator 24, and amplifier 30, and not by the frequency of oscillator 19.

Figure 2:
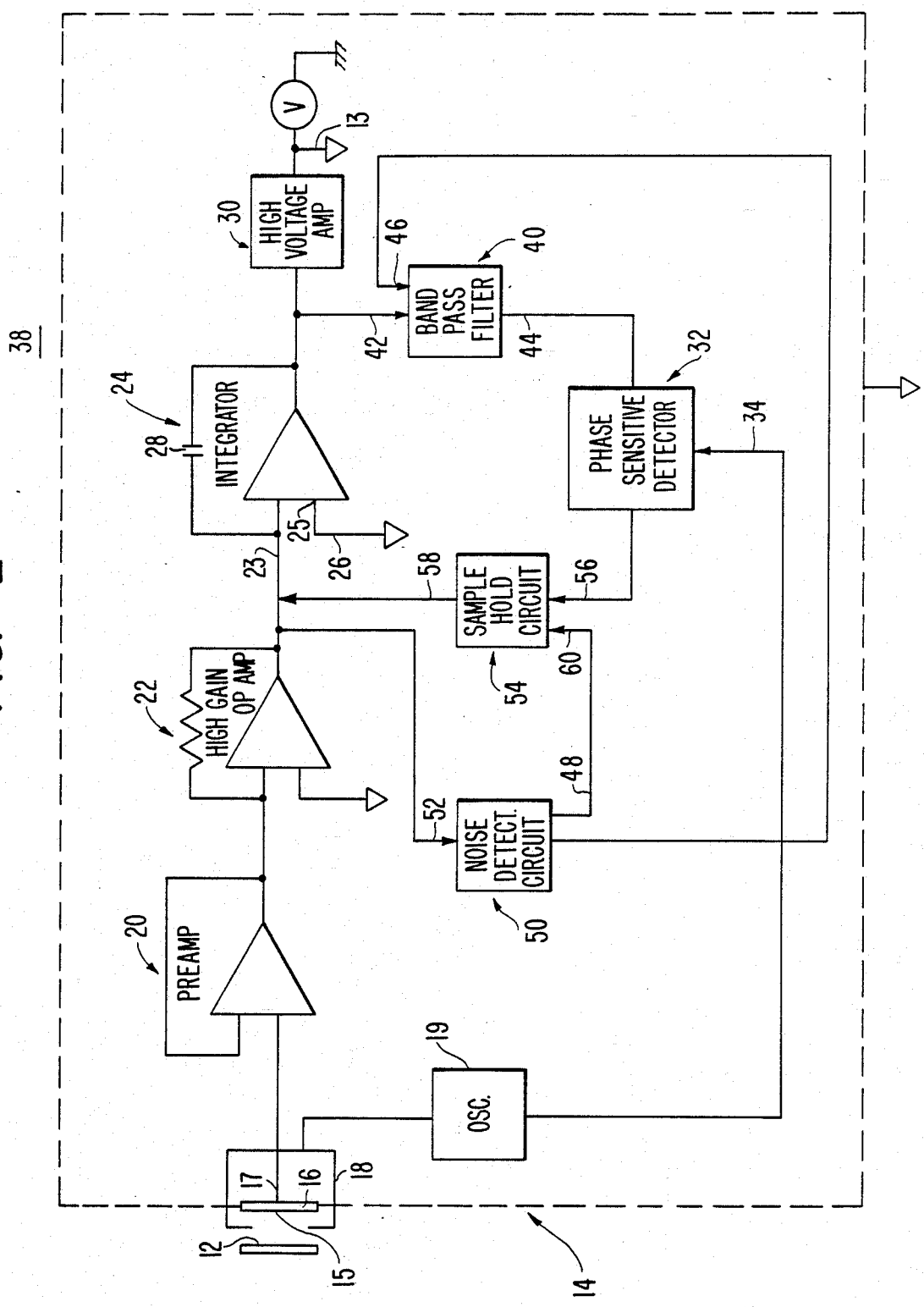
FIG. 2 is a block diagram of a second metering apparatus which includes a preferred embodiment of the invention.

FIG. 2 shows a second voltage metering apparatus 38. In addition to components described with regard to apparatus 10, apparatus 38 comprises means for disabling the feedback circuit upon occurrence of transient signals at the amplifying means output. As embodied herein, the disabling means includes a band pass filter 40, a noise detection circuit 50, and a sample-and-hold (SH) circuit 54. Band pass filter 40 has an input 42 connected to the output of integrator 24. Band pass amplifier 40 has an output 44 connected to the input of phase sensitive detector 32 and a disable terminal 46 connected to the output 48 of noise detection circuit 50. Noise detection circuit 50 has an input 52 connected to the output of amplifier 22.

Metering apparatus 38 also includes SH circuit 54 having an input 56 connected to the output of phase sensitive detector 32 and an output 58 connected to input 23 of integrator 24. SH circuit 54 also includes an enable terminal 60 connected to output 48 of noise detector 50. Band pass amplifier 40 and SH circuit 54 comprise part of the feedback circuit from the output of integrator 24 to the input of integrator 24.

Band pass amplifier 40 filters from the feedback circuit signals with frequencies not in the region of the reference frequency generated by oscillator 19. Signals having frequencies in the range of the reference frequency, for example, 800–1200 Hertz for a 1000 Hertz reference signal, are passed through phase sensitive detector 32 in order that the reference signal may be compared with the input signal to produce a signal which has been demodulated of the reference frequency, i.e., a signal having an amplitude and phase solely reflective of the voltage of test surface 12 and not superimposed on the reference signal. In this way, the reference signal is eliminated from the input to high voltage output 30 and therefore from the circuit common voltage so that the reference frequency signal will not cancel the voltage induced on sensing electrode 16, the voltage on sensing electrode being induced in accordance with the reference frequency.

Noise detection circuit 50 detects the presence of high amplitude transient signals which have the potential to cause inaccuracies in apparatus 38 by distorting the signal provided to integrator 24 by the feedback circuit, including phase sensitive detector 32. Upon occurrence of a transient, a signal is supplied to input 46 to disable band pass amplifier 40 and to input 60 to enable SH circuit 54. SH circuit 54 then supplies a constant signal to input 23 of integrator 24 until decay of the transient, at which time SH circuit 54 is disabled and normal operation of band pass filter 40 is restored.

Figure 3:
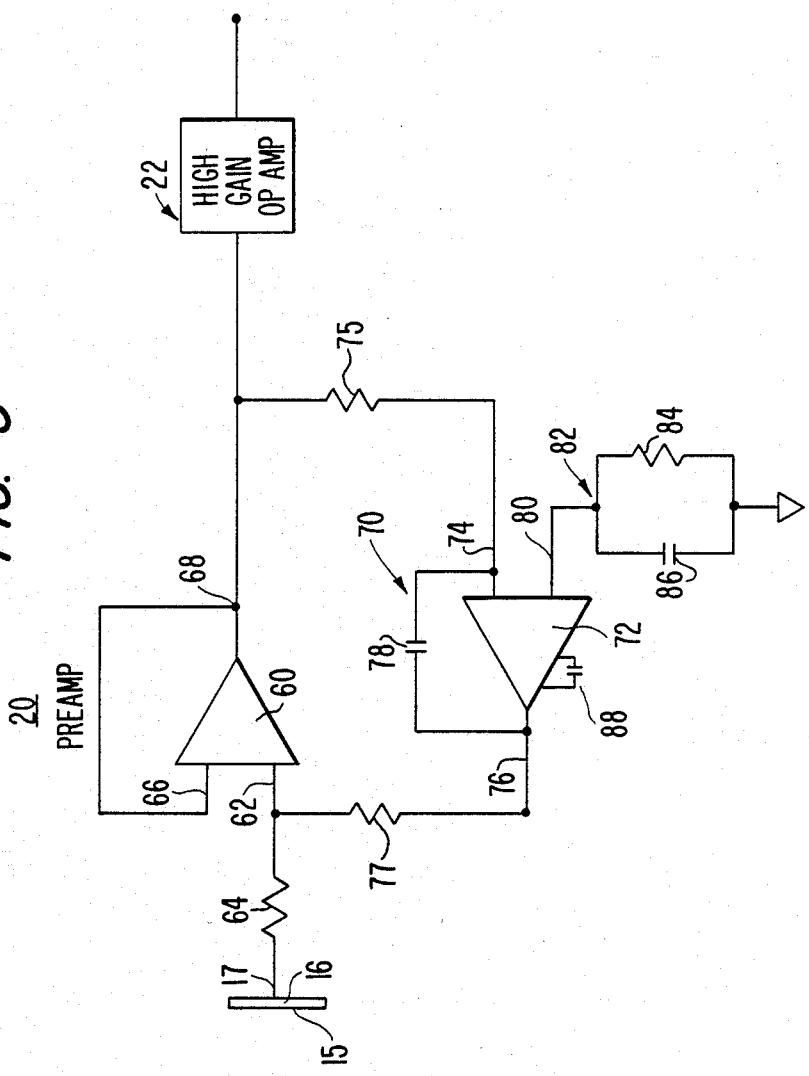
FIG. 3 is an electrical schematic diagram of the preamplifier shown in FIGS. 1 and 2.

Referring to FIG. 3, a wideband preamplifier 20 includes an operational amplifier 60. Output terminal 17 of sensing electrode 16 is coupled to an input 62 of operational amplifier 60 through a resistor 64. The other input 66 of operational amplfier 60 is connected to output 68 of operational amplifier 60. The input 62 of operational amplifier 60 is also coupled to the output of a preamplifier stabilizer 70. Preamplifier stabilizer 70 is an integrator with a feedback circuit from an input 74 to output 76 through a capacitor 78. Input 74 is also connected to the output of operational amplifier 60 through a resistor 75. The other input 80 of operational amplifier 70 is coupled to circuit common, i.e., housing 14 through a resistor-capacitor circuit 82 with a resistor 84 and a capacitor 86. Preamplifier stabilizer 70 also includes a capacitor 88.

Output 76 of preamplifier stabilizer 70 is connected to preamplifier input 62 through resistor 77. Apparatus 38 thus includes means for stabilizing the output of preamplifier 20. As embodied herein, the stabilizing means comprises preamplifier stabilizer 70. In apparatus 38, operational amplifiers 60 and 72 may comprise models LF356 and LM308 devices, respectively, commercially available from the National Semiconductor Corporation.

Figure 4:
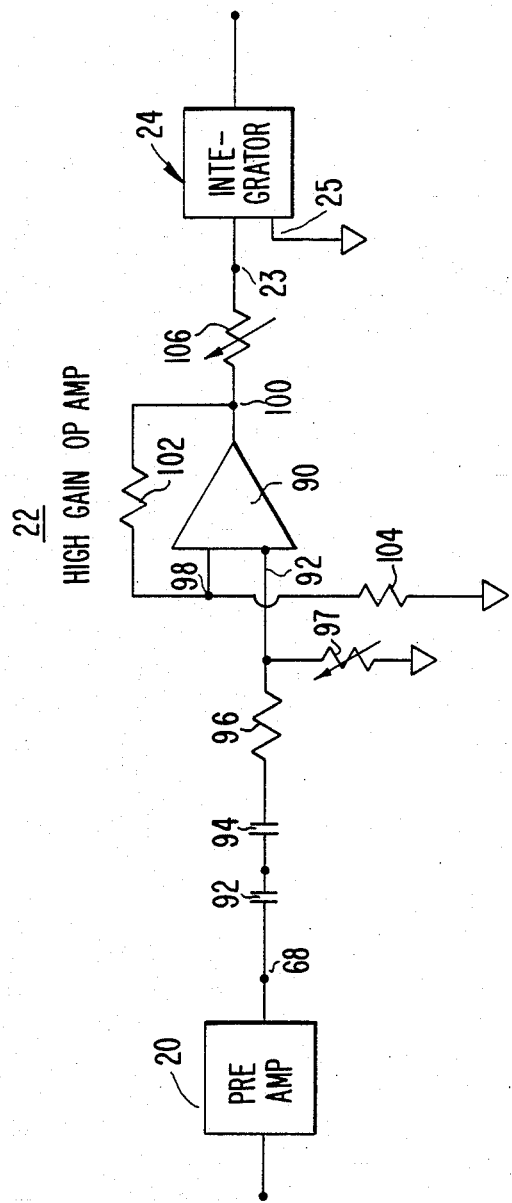
FIG. 4 is an electrical schematic diagram of the high-gain operational amplifier shown in FIGS. 1 and 2.

Referring to FIG. 4, the construction of wideband operational amplifier 22 is shown in greater detail. Amplifier 22 includes operational amplifier 90, which may be, for example, a type LF356 device commercially available from the National Semiconductor Corporation. One input 92 of operational amplifier 90 is coupled to output 68 of preamplifier 20 through capacitors 92 and 94 and resistor 96, and coupled through a variable resistor 97 to circuit common for adjustment of system gain. The other input 98 of operational amplifier 90 is connected to output 100 of operational amplifier 90 through a resistor 102. Operational amplifier output 100 is connected to input 23 of integrator 24 through variable resistor 106. Operational amplifier input 98 is tied to circuit common, i.e., housing 14 through resistor 104.

Figure 5:
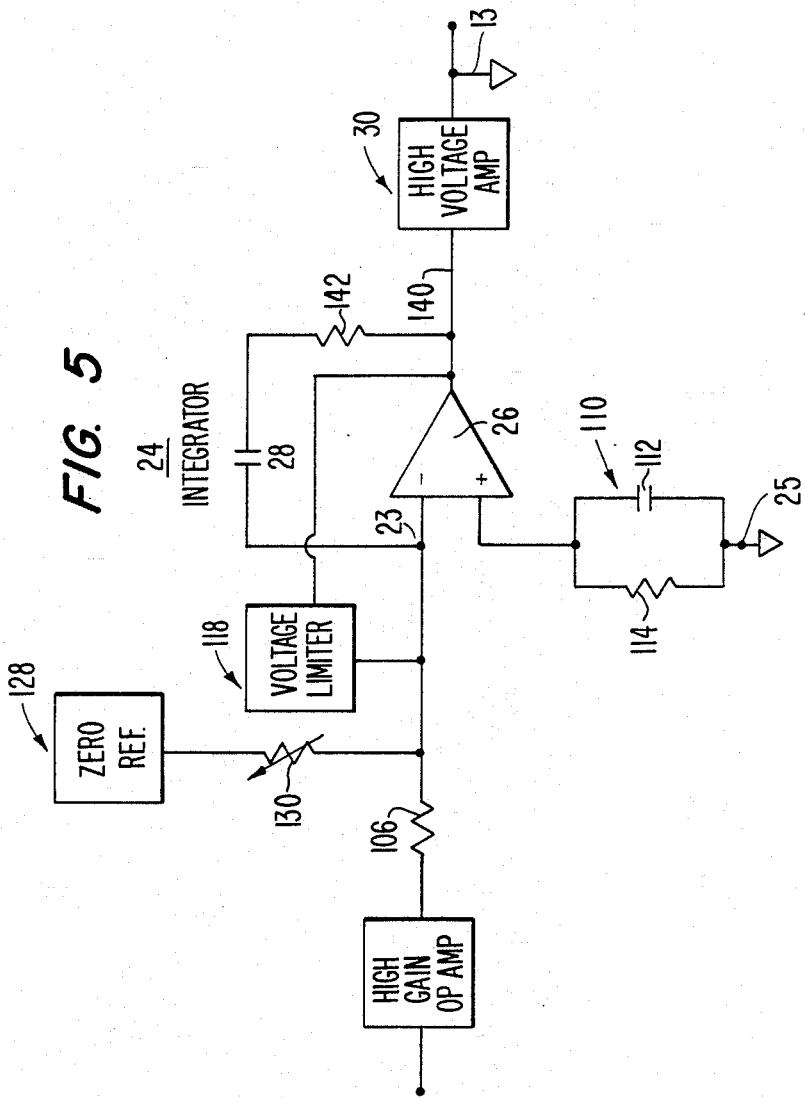
FIG. 5 is an electrical schematic diagram of the integrator shown in FIGS. 1 and 2.

Integrator 24 is shown in greater detail in FIG. 5. Integrator input 25 is connected to housing 14 and includes circuit 110 comprising capacitor 112 and resistor 114. Integrator input 23 is also connected to a voltage limiter 118. Voltage limiter 118 is used for "soft-clamping" to prevent integrator saturation which would disable system functioning. Also connected to integrator input 23 is a zero voltage reference 128 for instrument zero control. A variable resistor 130 is interposed between voltage reference 128 and input 23.

Operational amplifier 26 of integrator 24, which may be, for example, a type LF353 device commercially available from National Semiconductor Corporation, has an output 140 which is connected by a feedback circuit to input 23. The feedback circuit includes a resistor 142 between output 140 and capacitor 28, and capacitor 28 between resistor 142 and input 23. Voltage limiter 118 is also connected to output 140. Integrator 24 integrates the signal from high gain operational amplifier output 100, preserving the polarity of test surface 12 and driving the output 36 of high voltage amplifier 30 toward the voltage present at test surface 12.

High voltage amplifier 30 receives, for example, signals having an amplitude on the order of volts, e.g., 0 to 5 volts from integrator output 140 and has, for example, an output on the order of thousands of volts, e.g., 0 to 2000. High voltage amplifier 30 increases the input signal which is proportional to the voltage of test surface 16 to a voltage which is on the same order as the voltage present at test surface 16. Circuit common 26, in the form of housing 14, is driven to the actual test surface voltage by output 36 of high voltage amplifier 30 thereby causing the voltage between circuit common 26 and test surface 12 to approach zero. High voltage amplifier 30 is discussed in greater detail below.

Oscillator 19 which controls the frequency of vibration of sensing electrode 16 and provides the reference frequency to terminal 34 of phase sensitive detector 32, is of a type generally used in voltage metering apparatus and known to those of ordinary skill in the art.

Figure 6:
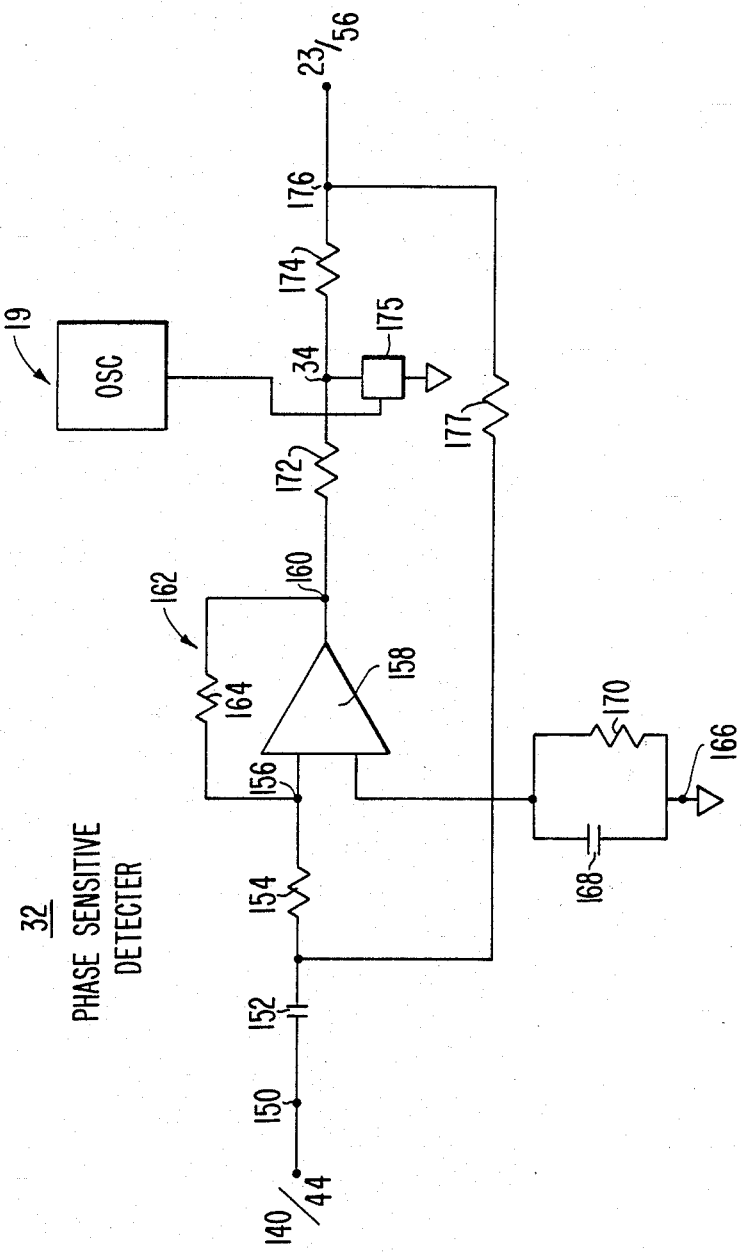
FIG. 6 is an electrical schematic diagram of the phase sensitive detector shown in FIGS. 1 and 2.

Phase sensitive detector 32 is shown in detail in FIG. 6. Phase sensitive detector 32 comprises an input 150 which is connected to integrator output 140 in metering apparatus 10 and band pass amplifier output 44 in metering apparatus 38. Input 150 is connected through a capacitor 152 and a resistor 154 to an input 156 of an operational amplifier 158 which may be, for example, a type LM308 device commercially available from National Semiconductor Corporation. An output 160 is connected to input 156 through a feedback circuit 162 comprising a resistor 164. An input 166 of operational amplifier 158 is connected to housing 14 and includes a circuit comprising a capacitor 168 and a resistor 170 in parallel. Output 160 is connected to reference terminal 34 through a resistor 172. Reference terminal 34 is also connected to one end of a resistor 174. The signal present at the other end of resistor 174 comprises an output 176 of phase sensitive detector 32. An oscillator-controlled gate 175 is used to forward the reference frequency to reference terminal 34. Output 176 is connected by a feedforward circuit to a node between capacitor 152 and resistor 154. Output 176 is also connected to integrator input 23 in metering apparatus 10 and to SH circuit input 56 in metering apparatus 38.

Figure 7:
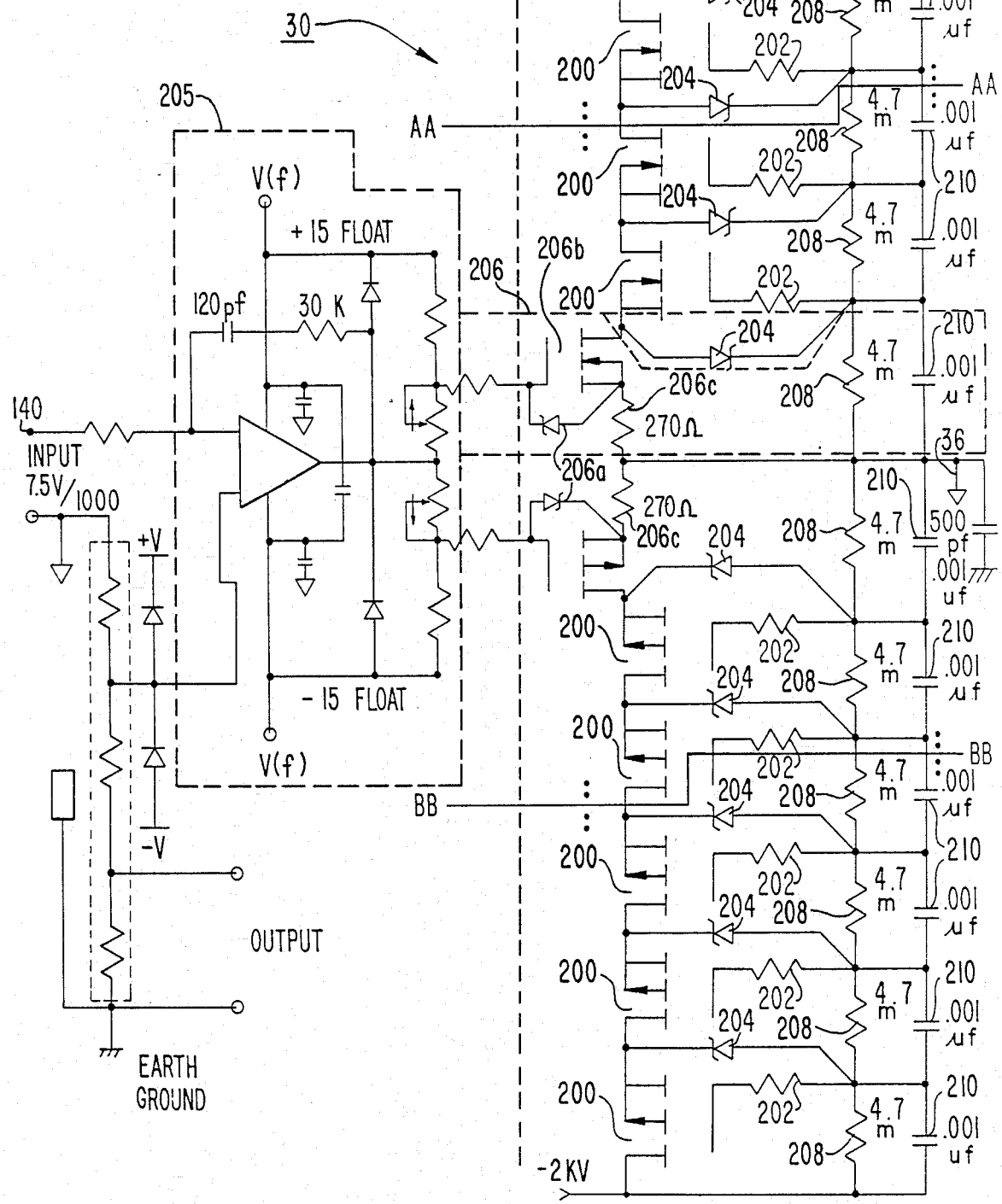
FIG. 7 is an electrical schematic diagram of a preferred embodiment of the present invention.

Referring to FIG. 7, the preferred embodiment of high voltage amplifier 30 includes a plurality of T-MOS power Field Effect Transistors (FETs) 200 in a series of resistor-capacitor divider controlled configurations. Resistors 202 in series with the FET gate leads prevent spurious oscillations in the voltage across the parallel capacitor-resistor circuits and to control the slew rate of FETs 200 Zener diodes 204 are used to clamp the FET gate source voltage to levels below which damage will occur. Lines AA and BB are illustrative of the fact that the circuit configuration may be added to indefinitely to achieve a desired high voltage output level.

More specifically, high voltage amplifier 30, in the preferred embodiment, comprises a preamplifier circuit 205 and two identically configured complimentary portions. Each of the portions is coupled to a high voltage power supply terminal of, for example, +2000 and −2000 volts, respectively. Voltage amplifier 30 amplifies the voltage at input 140. Each of the portions of amplifier 30 is coupled through preamplifier circuit 205 to input terminal 140 and comprises control means, coupled to receive, as input, the voltage at input 140, for generating an output current signal proportional to the voltage signal at input 140. As here embodied, the control means comprises a control circuit 206 including a zener diode 206a, a MOSFET 206b, a coupling resistor 208, and a capacitor 210 as shown in FIG. 7. Coupling resistor 208 and capacitor 210 each have first and second ends, the first ends being coupled to output terminal 36. The MOSFET is preferably connected as a voltage-to-current converter. The output current signal of the MOSFET of control circuit 206 flows through a current sense resistor 206c to output 36, which may have, for example, a resistance of 270 ohms, as shown.

Voltage amplifier 30 further comprises load means coupled to the control means 206 and to one of the high voltage power supply terminals for producing an output voltage signal from the output current of control circuit 206, the output voltage being proportional to the voltage at input 140. As here embodied, the load means includes a plurality of MOSFET circuits connected in cascade between a control circuit 206 and one of the high voltage power supply terminals. Each MOSFET circuit includes one of MOSFETs 200, each MOSFET having a gate, a source and a drain, and biased in its linear region. The MOSFET circuits are connected such that the voltage drop across each MOSFET circuit is substantially the same, with each MOSFET circuit sharing a portion of the voltage between control circuit and the power supply terminal. The number of MOSFET circuits of which the load means is comprised may be increased to allow amplification over any predetermined high voltage range.

Each of the loads means MOSFET circuits described above preferably includes a coupling resistor 208 having first and second ends. The first end of coupling resistor 208 is coupled to the gate of the MOSFET of that MOSFET circuit. The circuits also preferably include a capacitor 210 having first and second ends, the first end also being coupled to the gate of the MOSFET of that MOSFET circuit.

Preferably, the load means includes a termination circuit comprising a first one of the loads means MOSFET circuits, the drain of the respective MOSFET and the second ends of the respective coupling resistor 208 and capacitor 210 being coupled to the high voltage terminal.

Preferably, the load means also includes a plurality of connecting circuits 209 connected between control circuit 206 or of another connecting circuit 209 which is on the control circuit side of the first connecting circuit. The drain of connecting circuit 209 is connected to the source of the MOSFET of either terminating circuit 207 or another connecting circuit on the terminating circuit side of the first connecting circuit. For each connecting circuit 209, the first ends of the respective resistor 208 and capacitor 210 are connected to the second ends of resistor 208 and capacitor 210 of either control circuit 206 or of another connecting circuit 209 on the control circuit side of the first connecting circuit. For each connecting circuit 209, the second ends of the respective resistor 208 and capacitor 210 are connected to the first ends of either terminating circuit 207 or of another connecting circuit on the terminating circuit side of the first connecting circuit.

High voltage amplifier 30 may further include a gate resistor 202 coupled between the gate and the first ends of coupling resistor 208 and capacitor 210 of each MOSFET circuit. As discussed previously, gate resistor 202 prevents spurious voltage oscillations detectable by MOSFET 200, and prevents FET saturation during slewing conditions. As also discussed previously, zener diodes 204 are used to clamp the FET gate source voltage across the gate. Each MOSFET circuit except control circuit 206 includes a zener diode 204 coupled between the source of the MOSFET and the second end of coupling resistor 208 and capacitor 210 of that MOSFET circuit as a MOSFET voltage protector.

As described previously, band pass filter 40 is designed to operate in the range of the reference frequency at times when high amplitude transient signals have not been detected. Noise detector unit 50 disables band pass filter 40 whenever noise detector unit 50, which has an input 52 connected to the output of high gain operational amplifier 22, detects a high amplitude transient signal. When band pass filter 40 is disabled, SH circuit 54 is enabled by noise detector unit 50 through an enable terminal 60. SH circuit 54 receives the signal output from phase sensitive detector 32 at input 56 during times when high amplitude transient signals have not been detected. SH circuit 54 comprises a device (which may be, for example, a type LM308 integrated circuit device commercially available from the National Semiconductor Corporation with a J177FET from Siliconix Corporation) which holds the signal at input 56 for use during periods when the output of high gain operational amplfier 22 includes high amplitude transients and provides a constant signal to the input 23 of integrator 24 to preserve the long term stability of voltage metering even in the presence of transients.

It should be apparent to those skilled in the art that various modifications may be made to the high voltage amplifier of the subject invention without departing from the scope and spirit of the invention. Thus, it is intended that the invention cover modification and variations of the invention, provided they come into the scope of the appended claims and their legally entitled equivalents.

I claim:

1. A high voltage amplifier, coupled to a high voltage power supply terminal and having input and output terminals, for amplifying an input voltage signal supplied to said input terminal, said amplifier comprising:

control means, coupled to said input terminal, for generating an output current signal proportional to said input voltage signal; and load means, coupled to said control means and to said high voltage power supply terminal, for producing an output voltage signal from said output current, said output voltage signal being proportional to said input voltage signal, said load means including a plurality of MOSFET circuits connected in cascade between said control means and said high voltage power supply terminal, said MOSFET circuits each including a MOSFET having a gate, a source and a drain, and biased in the linear region;

said MOSFET circuits being connected such that the voltage drop across each of said MOSFET circuits is substantially equal.

2. The high voltage amplifier of claim 1 wherein said control means includes a MOSFET connected as a voltage-to-current converter.

3. The high voltage amplifier of claim 1 wherein each of said load means MOSFET circuits comprises:
   a coupling resistor having first and second ends, said first end being coupled to the gate of the MOSFET of the respective MOSFET circuit, and
   a capacitor having first and second ends, said first end being coupled to the gate of the MOSFET of the respective MOSFET circuit;
wherein said control means comprises a preamplifier connected to said input terminal and a control circuit, said control circuit comprising:
   a control circuit MOSFET having a source, a drain, and a gate,
   a gate resistor having first and second ends, said first end being connected to the gate of said control circuit MOSFET and said second end being connected to said preamplifier,
   a current sense resistor having first and second ends, said first end being connected to said amplifier output terminal and said second end being connected to the source of said control circuit MOSFET, and
   a divider circuit including a resistor and a capacitor and having first and second ends, said first end being connected to said amplifier output terminal; and
wherein said load means comprises:
   a termination circuit comprising a first of said MOSFET circuits, the drain of the respective MOSFET and the second ends of the respective coupling resistor and capacitor being coupled to said high voltage terminal, and
   a connecting circuit comprising a second of said MOSFET circuits, the drain of the respective MOSFET being coupled to the source of said termination circuit MOSFET, the source of the respective MOSFET being coupled to the drain of said control circuit, the first ends of said connecting circuit MOSFET circuit coupling resistor and capacitor being coupled to the second ends of said control circuit coupling resistor and capacitor, and the second ends of said connecting circuit coupling resistor and capacitor being coupled to the first ends of the said termination circuit coupling resistor and capacitor.

4. The high voltage amplifier of claim 3 wherein each of the MOSFET circuits includes a gate resistor connected between the gate and the first ends of the coupling resistor and the capacitor of the respective MOSFET circuit.

5. The high voltage amplifier of claim 3 wherein said termination circuit and said connecting circuit each include a MOSFET voltage protector comprising a zener diode coupled between the source of the respective MOSFET and the first end of the coupling resistor of the respective MOSFET circuit.

6. The high voltage amplifier of claim 3 wherein said control means comprises a pair of said control circuits; and said load means comprises a pair of load circuits each coupled to a respective one of said control circuits and each comprising one f said termination circuits connected to a separate high voltage terminal, and a plurality of said connecting circuits.

* * * * *